United States Patent
Sonnaillon

(10) Patent No.: US 9,871,442 B2
(45) Date of Patent: Jan. 16, 2018

(54) ZERO-OFFSET VOLTAGE FEEDBACK FOR AC POWER SUPPLIES

(71) Applicant: Pacific Power Source, Inc., Irvine, CA (US)

(72) Inventor: Maximiliano O. Sonnaillon, Santa Fe (AR)

(73) Assignee: Pacific Power Source, Inc., Irvine, CA (US)

( * ) Notice: Subject to any disclaimer, the term of this patent is extended or adjusted under 35 U.S.C. 154(b) by 0 days.

(21) Appl. No.: 14/999,526

(22) Filed: May 19, 2016

(65) Prior Publication Data

US 2016/0344403 A1    Nov. 24, 2016

Related U.S. Application Data

(60) Provisional application No. 62/179,904, filed on May 21, 2015.

(51) Int. Cl.
  *H03M 1/12* (2006.01)
  *H02M 3/157* (2006.01)
  *H02M 7/538* (2007.01)

(52) U.S. Cl.
  CPC ....... *H02M 3/157* (2013.01); *H02M 7/53803* (2013.01); *H03M 1/12* (2013.01); *H03M 1/1245* (2013.01)

(58) Field of Classification Search
  CPC ...... H03M 1/1245; H03M 1/12; H02M 3/157; H02M 7/53803
  USPC .................................. 341/155, 122; 323/271
  See application file for complete search history.

(56) References Cited

U.S. PATENT DOCUMENTS

| | | | |
|---|---|---|---|
| 6,411,242 B1 | 6/2002 | Oprescu et al. | |
| 7,098,823 B2 | 8/2006 | O'Dowd et al. | |
| 7,193,545 B2 * | 3/2007 | Morrow | H03M 3/34 341/143 |
| 7,315,157 B2 | 1/2008 | Chapuls | |
| 7,551,110 B1 * | 6/2009 | Tsyrganovich | H03M 3/34 329/307 |
| 7,554,310 B2 | 6/2009 | Chapuis | |
| 7,710,092 B2 | 5/2010 | Chapuis | |
| 7,907,076 B2 | 3/2011 | Yoshida et al. | |

(Continued)

OTHER PUBLICATIONS

Mary McCarthy, Chopping on the AD7190, AD7192, AD7193, AD7194, and AD7195, Analog Devices, Application Note, 2011 USA.

(Continued)

*Primary Examiner* — Brian Young
(74) *Attorney, Agent, or Firm* — Gibbs & White P.C.; Franklin E. Gibbs

(57) ABSTRACT

A high voltage AC measurement method and circuit is disclosed to measure with zero offset and mirrored distortion based on hybrid chopping and fully differential signal path. There is a scheme with hybrid chopping and dual mixed signal paths. It applies high frequency chopping to the voltage measurement signal before the low-voltage signal conditioning, then samples and converts it to digital with two simultaneous ADCs, and finally demodulate the chopped signal by software. This technique not only reduces DC errors and drift but also cancels the distortion asymmetry caused by ADC non-linearity. The resultant DC accuracy and resolution can be significantly smaller than 1 LSB.

2 Claims, 5 Drawing Sheets

(56) References Cited

U.S. PATENT DOCUMENTS

| | | | | |
|---|---|---|---|---|
| 7,999,710 B2* | 8/2011 | Matthews | ............... | H03M 3/34 |
| | | | | 341/143 |
| 8,471,744 B1* | 6/2013 | Wan | ........................ | H03M 3/34 |
| | | | | 341/143 |
| 8,742,964 B2* | 6/2014 | Kleks | .................... | H03M 3/494 |
| | | | | 327/100 |

OTHER PUBLICATIONS

James Bryant, et al, Chapter 1: OP AMP Basics, OP AMP Applications, Analog Devices, USA.

Texas Instruments, Digital PWM System Controller with 4-bit, 6-bit, or 8-bit VID Support, Data Sheet, SLVSAL7A—Nov. 2010—Revised Feb. 2011 USA.

\* cited by examiner

ZERO-OFFSET VOLTAGE FEEDBACK FOR AC POWER SUPPLIES

RELATED APPLICATIONS

This application claims priority under 35 U.S.C. §119 to U.S. Provisional Application No. 62/179,904 filed on May 21, 2015, the contents of which are incorporated herein by reference in their entirety.

FIELD OF THE INVENTION

This invention generally relates to alternating current power supplies.

BACKGROUND OF THE INVENTION

Digital electronics has replaced analog electronics in numerous applications during the last decades because it brings performance improvements but also reduces cost and size. Digital control of switching power converters is a relatively new field because semiconductor technology did not enable effective implementations before. In the field of alternating current (AC) power supplies, digital control allows significant performance improvements, such as lower distortion in the generated waveform, superior measurement accuracy, better stability and protection schemes, and gives flexibility to change operating parameters in real time.

In fully digital controlled power converters, a microprocessor or gate array implements all the control loops and directly defines the transistors switching. It presents several advantages, such as accuracy, stability and flexibility, but also numerous technical challenges, such as speed and measurement resolution, and that is why it had not been widely adopted until recently.

Distortion and offset drift in the signal conditioning and acquisition are critical parameters for AC power supplies, in particular, when working as voltage source (i.e. controlled output voltage). Certain types of loads require ultra-low DC levels. For example, transformers and inductors have low impedance at low frequency, hence any offset or asymmetry (even-number harmonics) in the voltage causes undesired DC currents. Typical programmable high power AC supplies require a maximum offset of less than +/−20 ppm of the full scale voltage measurement, this is +/−20 mV in a 1000V range (+/−500V).

Prior art requires the use of ultra-low offset signal conditioning and high resolution ADCs to acquire this signal, which presents technical challenges due to the speed and bandwidth required by the voltage feedback and measurements calculations. High speed and high accuracy at the same time causes significant increments in cost, size and system complexity.

For example, parallel output bus (as opposed to serial) ADCs must be used to avoid excessive data transfer delays, and this has several impacts:

1). Substantially reduces the pool of off-the-shelf integrated circuits that can be used for both ADCs and microprocessors.

2). Increases circuit complexity and size due to the size of the packages and number of digital signals in the bus.

3). Increases cost because of the resultant complexity in circuits and price of electronic devices.

Even when using 16-bit ADCs with best-in-class linearity levels (e.g. integral non linearity of 1 LSB), the maximum error is in the order of the maximum allowed, thus making it not a reliable solution. Using the same application example of a full range of +/−500V, a 16-bit ADC gives a resolution of 15 mV, with a maximum non-linearity error of the same level.

Even if the ADC had zero-offset (e.g. by use of internal chopping), it still requires conditioning stages to prepare the analog signal to be sampled and converted as illustrated in FIG. 3 that addresses the prior art. In FIG. 3, an HVAC source (60) is connected to resistors (62) that in turn are connected to a differential amplifier circuit (64). The output of the amplifier (64) is input to a sample and hold/ADC circuit (66). The voltage measurement signal is conditioned and then converted to digital to be used by the processor. The analog signal conditioning and ADC input can also be differential to eliminate effects of common mode errors. In the circuit of FIG. 3, any offset added by signal conditioning circuits (62) will not be cancelled by zero-offset techniques of the ADC circuit (66).

Prior art created competitive solutions by using non-programmable digital controllers that implement control loops with digital logic, and use low cost ADCs to digitize the signals from the power stage. Some commercial ICs (e.g. Texas Instruments, UCD9222 digital controller) use very low resolution ADC (6 bit) to digitize the error signal, instead of converting to digital the voltage feedback, to be used by the control loop. It first converts from digital to analog the voltage reference, then calculates the error in the analog domain and finally converts to digital the error signal. Since the error signal is expected to have a small amplitude when the loop is regulating, the input range of the ADC can be small and that makes even a low resolution enough to regulate the output voltage in modest performance applications.

Considerable effort has been spent to reduce cost and optimize the analog to digital conversion in digitally controlled switching converters as identified in FIG. 1 (excerpt from of U.S. Pat. No. 7,554,310 to Chapuis et al). This figure depicts a switched mode voltage regulator 10 having a conventional digital control circuit. The voltage regulator 10 comprises a buck converter topology to convert an input DC voltage $V_{in}$ to an output DC voltage $V_o$ applied to a resistive load (20) ($R_{load}$). The voltage regulator (10) includes a pair of power switches (12), (14) provided by MOSFET devices. The drain terminal of the high-side power switch (12) is coupled to the input voltage $V_{in}$, the source terminal of the low-side power switch (14) is connected to ground, and the source terminal of power switch (12) and the drain terminal of power switch (14) are coupled together to define a phase node. An output inductor (16) is coupled in series between the phase node and the terminal providing the output voltage $V_o$, and a capacitor (18) is coupled in parallel with the resistive load $R_{load}$. Respective drivers (22), (24) alternatingly drive the gate terminals of the power switches (12), (14). In turn, digital control circuit (30) controls operation of the drivers (22), (24). The opening and closing of the power switches (12), (14) provides an intermediate voltage having a generally rectangular waveform at the phase node, and the filter formed by the output inductor (16) and capacitor (18) converts the rectangular waveform into a substantially DC output voltage $V_o$. The voltage feedback of the loop is attenuated by a resistive divider (26 and 28) to be compared against the reference. A difference circuit (32) calculates the error, which is an analog signal that is then converted to digital by an ADC (34), coupled to a compensator (36), which is coupled to a digital pulse-width-modulator (38) that controls the transistor drivers (22 and 24).

The above mentioned techniques represent convenient solutions for low-cost and modest performance converters, often DC to DC converters with fixed or slow varying setpoints. In case of programmable AC sources, the actual output voltage signal needs to be converted with high accuracy because it is required by the control loop and also the measurement circuits for monitoring purposes. Hybrid techniques (e.g. DAC+ADC) do not represent convenient solutions for high frequency AC supplies because of their impact in accuracy, bandwidth and transient response.

In the field of high precision analog electronics, amplifying and processing signals with high DC accuracy has been a challenge due to offset and drift in the analog circuits. A technique often referred as chopping is a well-known and widely adopted to reduce or eliminate offset and drift in certain types of applications.

FIG. 2 shows a simplified block diagram of a conventional chopped amplifier (40). A low frequency input voltage (42), usually low level signal, is required to be amplified without adding DC error. A first modulation block (44) (often implemented with analog switches) converts the input signal to a high frequency square wave (46) with positive and negative peak values equal to the input voltage. The amplifier (48) introduces a gain G to the AC signal and also adds an undesired offset Voff, which can also drift with temperature and/or time. The output of the amplifier is demodulated to convert it back to low frequency and then filtered with a low pass filter (50). Any DC component added by the amplifier is converted to AC by the demodulator stage, and the low pass filter (50) is required to filter out this component.

Chopping and similar techniques are widely used in precision instruments ("The Art of Electronics", third edition, 2015, ISBN-13: 978-0521809269, ISBN-10: 0521809266), integrated operational amplifiers (Walter G. Jung, "Op Amp Applications Handbook", Analog Devices, 2002, ISBN 0-916550-26-5, ch. 1, p. 1.98), thermocouple based measurement and sensor bridges, among other applications. Similar techniques are referred as chopper-stabilized amplification, synchronous detection, and modulation/demodulation.

Chopping can also be used in mixed signal circuits in order to obtain offset-free analog to digital conversions. Application Note 1132 from Analog Devices describes how chopping is used in sigma delta ADCs to measure slow changing signals. These converters are typically low speed (i.e. less than 5 ksps) and require a low pass filter at the output. Prior art presents a number of inventions related to the design of high precision analog to digital converter integrated circuits.

U.S. Pat. No. 6,411,242 (2002): Proposes a method to improve the DC offset performance of oversampling analog to digital converters by using chopping in the analog section and sequentially demodulate the output by using the decimator, which is required because of the oversampling.

U.S. Pat. No. 7,098,823 (2006): Addresses the optimization of the chopping rate in the analog section of analog to digital converter ICs U.S. Pat. No. 7,551,110 (2009): Claims an IC with direct connection to the sensor, with chopping, oversampling at substantially higher frequency than the chopping, and then a sequential demodulation. It proposes adding an intermediate low pass filter to eliminate high frequency noise.

U.S. Pat. No. 7,907,076 (2011): Applies analog chopping and digital demodulation to inside a sigma delta ADC.

The above mentioned prior art differs from the present invention mainly, but not exclusively, in the following ways:

1) They are all applied to IC design. In AC power supplies, the high voltage is required to be attenuated down to reasonable IC voltage levels (3 to 5V) by using signal conditioning. Signal conditioning at low voltage levels can add undesired offset and distortion close to the rails. As described in a preferred embodiment of this invention, it is convenient to perform the modulation at higher voltage levels to minimize or eliminate the impact of signal conditioning offset and distortion.

2) The demodulation is done by averaging or filtering two or more samples, introducing extra delay or phase lag in the conversions. Furthermore, since the two samples of each switch state are not taken at the same time, this also creates an artificial offset error due to ripple in the voltage reference, bias supply, or coupled noise synchronized with the chopping signal.

As is described in the preferred embodiment of this invention, in order to obtain sub-LSBs (least significant bit) offset accuracy, resolution and stability, a scheme with simultaneous, fully differential conversion is implemented by means of two parallel sample and hold circuits, referred here as dual acquisition.

3) Prior art addresses and solves the most common application of measuring a slow changing signal with high DC accuracy. The application that this invention addresses differs because it consists of the measurement of a large AC signal that covers the whole ADC range, but with a required DC precision smaller than 1 LSB. This application also requires any non-linearity to be compensated in a way that does not cause asymmetries between positive and negative signals, often referred as even-number harmonics.

Because of the above mentioned reasons, it is desirable to use low cost, medium accuracy ADCs that are usually smaller and can be found embedded in the same IC as the microcontroller or digital signal processor.

SUMMARY OF THE INVENTION

One embodiment of a high voltage AC measurement circuit in accordance with the present invention to measure with zero offset and mirrored distortion is based on hybrid chopping and fully differential mixed-signal processing. It utilizes signal modulation done in the analog domain by using switches at mid or high voltage level, fully differential signal processing that includes dual simultaneous sampling, and signal demodulation performed in the digital domain. The dual processing circuit provides symmetry (i.e. time and circuit signal wise) between the differential channels and also minimize delays. The voltage acquisition provided by the circuit presents offset and drift levels that are several times smaller than one ADC least significant bit (LSB), also substantially attenuates distortion that produces even-order harmonics.

In another embodiment, a high voltage AC measurement system for a high voltage AC source is provided, which includes a first stage including a differential voltage divider that attenuates a high voltage input from the high voltage AC source and produces a differential mid-voltage output; a second stage including two pairs of analog switches coupled to the differential mid-voltage output, the second stage producing a switched output; a third stage including a pair of differential amplifiers coupled to the switched output, the second stage swapping the inputs of the pair of differential amplifiers, and one of the pair of differential amplifiers has reversed input polarity, the pair of differential amplifiers produces two single-ended (as opposed to differential) signals corresponding to a positive version and a negative versions of the switched output, the two single-ended signals alternate at each chopping cycle depending on the position of the switches; a fourth stage including two sample and hold circuits respectively coupled to one of the two single-ended signals, each of the two single-ended signals coupled to a respective analog to digital converter together simultaneously producing respective digital signals; and a fifth stage including an adder which adds the respective digital signals and produces an added output, a multiplier which demodulates the added output, and a chopping clock, which produces a plurality of chopping cycles, and synchronizes the multiplier, the sample and hold circuits, the respective analog to digital converters, and the second stage switches, the fifth stage producing a digital representation of the AC output voltage of the power supply.

BRIEF DESCRIPTION OF THE DRAWINGS

The invention is generally shown by way of reference to the accompanying drawings in which.

DETAILED DESCRIPTION OF THE INVENTION

This invention deals with the optimization of the output voltage sensing, needed as the feedback of the power converter and instrumentation measurements, among other uses. The output power signal is usually high voltage, typically 300 Vrms or higher can be generated by this type of supplies, and needs to be converted to digital in order to be processed by the controller. Since this measurement is used as loop feedback to regulate the output voltage, measurement errors are replicated in the output waveform dial the converter synthetizes.

The novel chopping technique of this invention allows the system to obtain offset and symmetry with a resolution and accuracy levels several times smaller than one LSB, referred here as sub-LSB accuracy. For the previous example of a 12-bit ADC that some microcontrollers have on-chip, 1-LSB represents an output voltage of 244 mV. This is 12 times higher than the hypothetically specified maximum offset. The circuit of this invention can obtain the required level of accuracy and stability, even with this kind of ADCs and without any significant performance impact.

Details of the Preferred Embodiment

Figure 1:
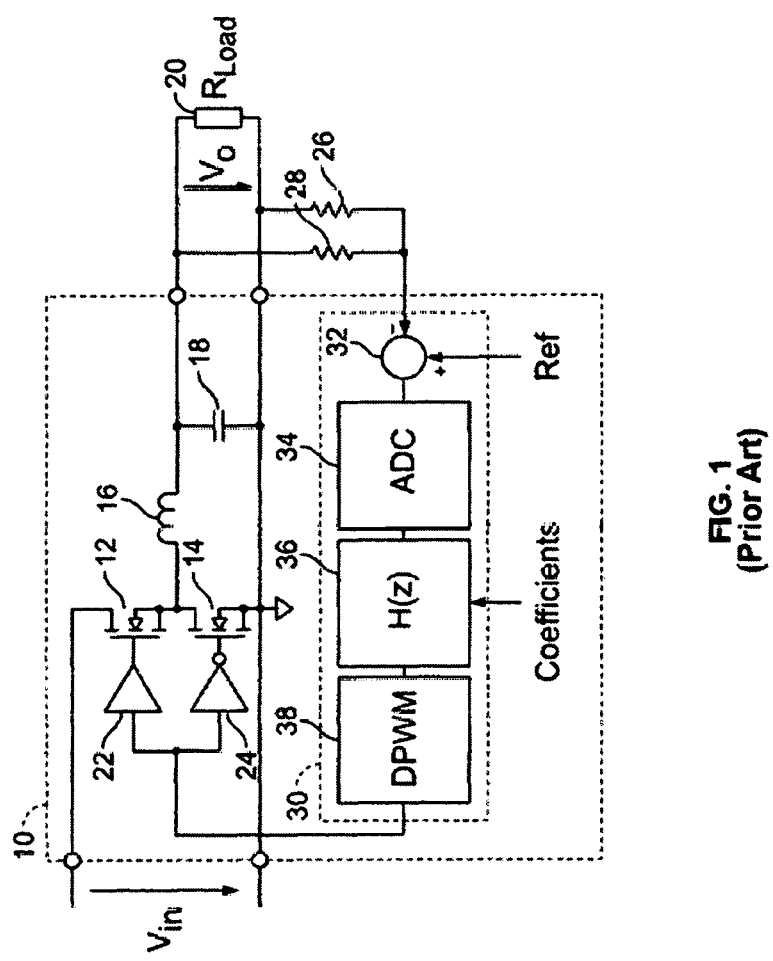
FIG. 1 is a block circuit diagram of a prior art switched mode voltage regulator having a conventional digital control circuit that digitizes the voltage error signal instead of the feedback.
Figure 2:
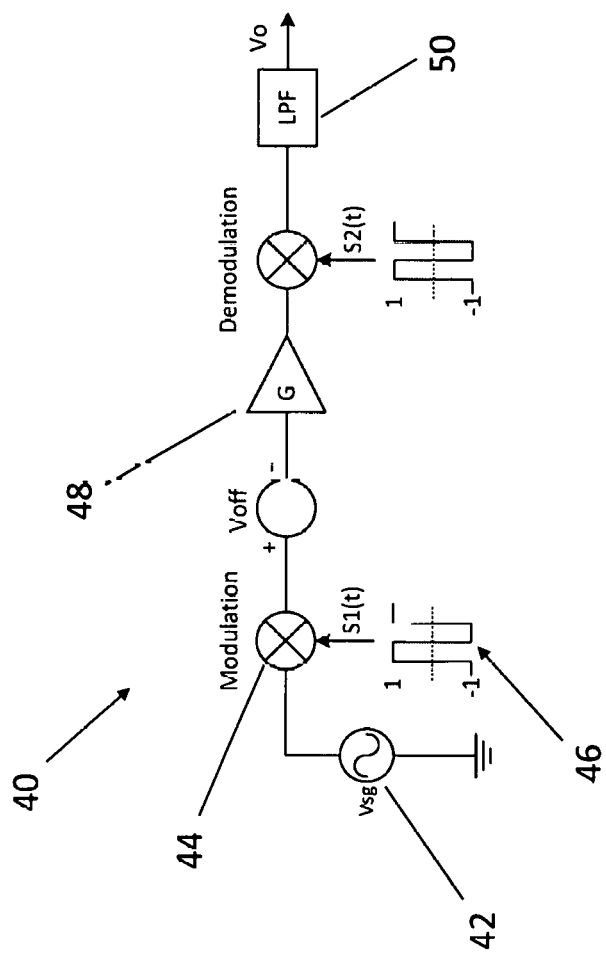
FIG. 2 is a block diagram of a prior art conventional chopped amplifier.
Figure 3:
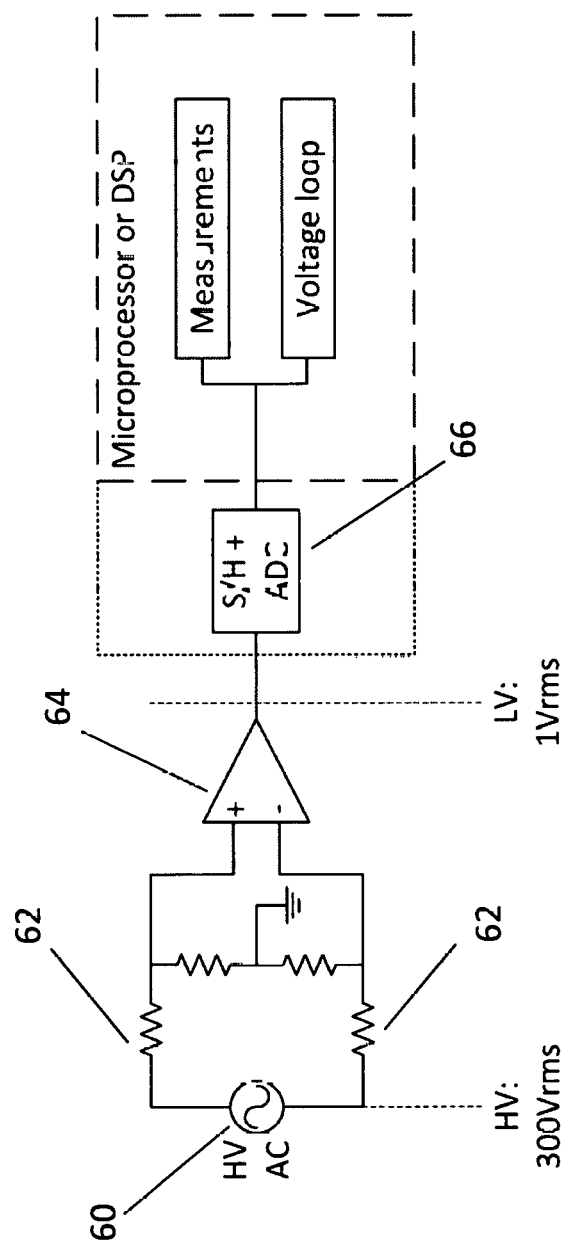
FIG. 3 is a block circuit diagram of the prior art where the voltage measurement signal is conditioned and then converted to digital to be used by the processor.
Figure 4:
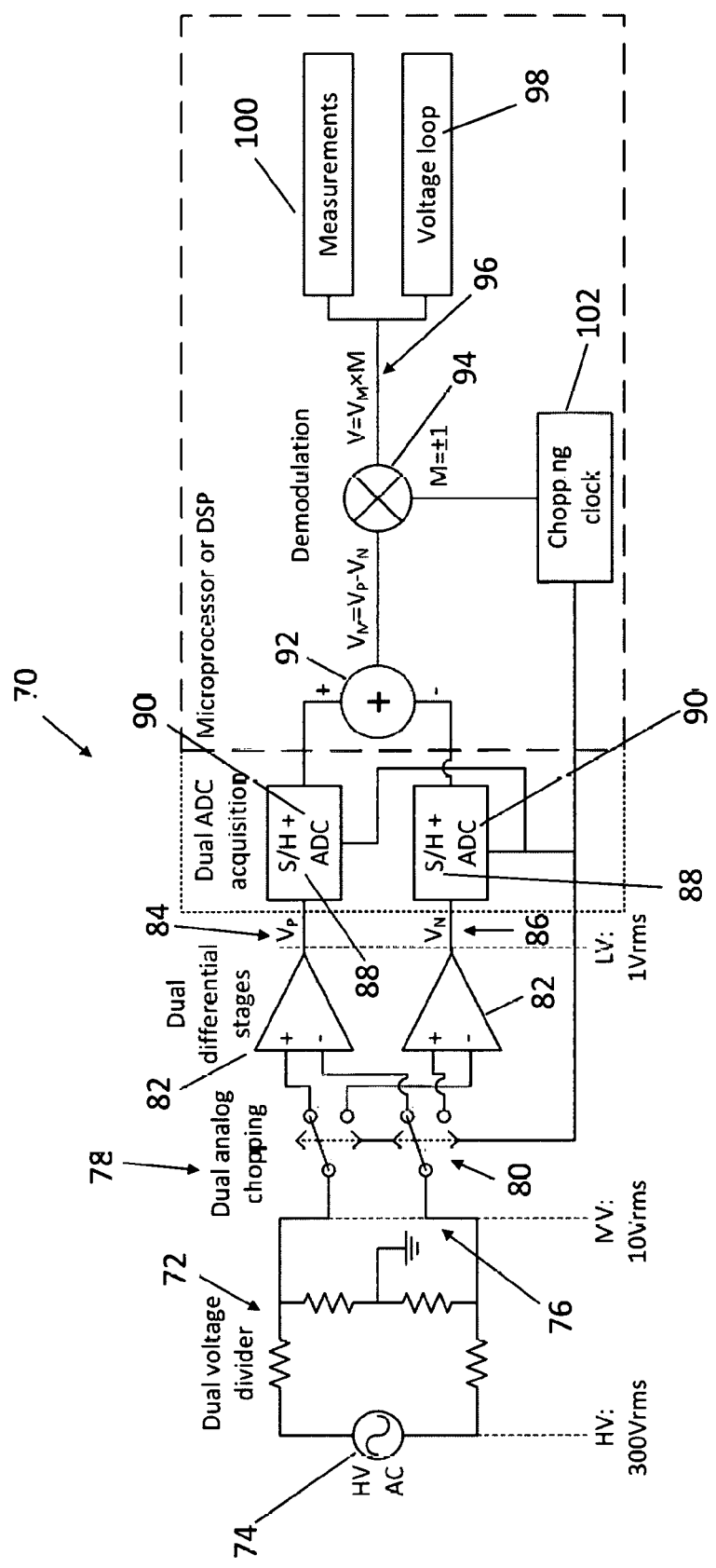
FIG. 4 is a schematic diagram of a preferred embodiment of the invention.

FIG. 4 presents a zero-offset voltage feedback (70) circuit that is the preferred embodiment of this invention. Circuit (70) consists of a fully differential mixed signal processing circuit that converts a high voltage signal to a number in a microprocessor. The first stage is a pair of voltage dividers (72) that attenuate the high voltage input (74) (e.g. 300 Vrms) to a differential mid-voltage (76) (10 Vrms) signal that can be handled by conventional technology of analog switches. The second stage, referred as dual analog chopping (78), is to modulate the differential pair simultaneously by using two pairs of analog switches (80), swapping the inputs of two differential amplifiers (82). In an alternative embodiment the voltage divider is used after the modulation stage, and the analog switching is done at the high voltage level. It is advantageous to implement the modulation at a very early stage of the signal processing path because it prevents any offset or distortion added by the analog stages from affecting the final result. Offset and asymmetric distortion added after the modulation will be canceled by the demodulation.

In an another alternative embodiment, there is a pair of low-offset differential amplifiers before the switches used to reduce the impedance at the input of the analog switches, which operate with a mid-voltage to minimize the impact of added offset and distortion.

The third stage is a pair of differential amplifiers (82) that eliminate common mode voltage present in the input signal. Note that one amplifier has reversed input polarity to provide an inverted signal at its output. Amplifiers (82) generate two single ended signals that correspond to the positive (84) and the negative (86) versions of the input signal, which alternate at each chopping cycle depending on the position of the switches. In a fourth stage, both single ended signals are then simultaneously sampled by two sample and hold (S/H) circuits (88), and then converted to digital by the analog to digital converters (ADC) (90). In an alternative embodiment of the invention, the differential amplifiers are fully differential (i.e. have differential outputs) and the S/H and ADCs have differential inputs. The S/H (88) and ADC (90) can be part of the same integrated circuit, and also can be part of a unique IC, often referred as SoC (system on chip), which integrates them with a microprocessor, microcontroller or digital signal processor.

In a fifth stage, the difference between the result of the two conversions is digitally calculated (92) and multiplied (94) by the sign of the chopping state (+1 or −1) as indicated by the chopping clock (102). The order of subtraction and multiplication can be changed to calculate the difference after the multiplication, producing the same mathematical result but with one extra operation. The resultant demodulated signal (96) has a small AC chopping frequency component mostly caused by the offset difference between the two parallel signal conditioning stages. Since the two signal conditioning and conversion stages are the same and often implemented in the same ICs, they are expected to have similar offset drift. This offset matching minimizes the level of spurious AC caused by the demodulation. Any fixed offset difference between channels can be calibrated by software, hence only drift can potentially cause a small spurious AC. The stability matching between the two channels can be further improved by the use of ICs with dual operational amplifiers and also by using a single ADC with two S/H stages. It is worth to note that channel matching does not affect DC performance, but it is desired to minimize the AC component generated by the demodulation. Prior art chopping techniques, which do not use dual parallel conversions, are not able to minimize this AC spurious signal. In conventional chopping that uses sequential demodulation, the spurious AC component depends on the natural offset added by the circuits (analog and mixed signal) that process the signal between modulation and demodulation stages, and which can have significant amplitude (e.g., >1 LSB). One way to eliminate the resulting chopping component is by averaging consecutive samples, thus adding delay to the conversion and affecting the effective sampling rate.

The chopping circuit is refereed as hybrid because it makes use of discrete analog circuits to perform modulation (chopping), and demodulation is done by digital signal processing (DSP). DSP is typically implemented with a microprocessor or gate array. DSP based demodulation provides no added offset because it is already in the digital domain. The entire signal processing path is referred as fully differential because each channel, positive and negative, is independently (and simultaneously) sampled and converted to digital. This is necessary to minimize and virtually eliminate the impact of ripple and periodic transients caused by switching in chopping circuits, which create differences between each state of the switches and affect the resulting offset of the conversions. When converting one signal at each chopping state, as done in prior art, any periodic perturbation in the system that is synchronized with the chopping frequency can cause significant errors. In case of switching power supplies this issue is particularly important because they create a noisy environment for the electronics, and it is a common practice to synchronize the feedback sampling with the power stage switching. The circuit in this invention performs simultaneous processing and sampling of each channel, to maximize symmetry, enabling sub-LSB offset accuracy and mirrored distortion without any calibration required. The second benefit of simultaneously sampling the two states of the chopping is that it eliminates the delay added by the sequential demodulation used in prior art, and this is particularly important when the conversions is used as a control loop feedback.

Referring back to FIG. 4, in one embodiment of this invention, the resultant conversions of the output voltage are used by a real time voltage control loop (98) and also by a measurements engine (100) used for monitoring and protection purposes. The real time control loop employs the voltage measurement as feedback to calculate an error. The error is used by a compensator to control the pulse width modulation (PWM) module that drives the transistors of the power stage. The measurements engine calculates the root mean square (RMS) and DC (average) of the voltage by using real time digital signal processing. The DC calculation is based on averaging the input over an integer number of periods of the AC waveform. Since the sampling frequency and the output frequency could be not exact multiples, window functions (e.g., Hanning window) can be used to eliminate bordering effects. The RMS value is calculated with a similar method but by averaging the square of the voltage measurement, and then calculating the root square of the averaged result.

Both processing algorithms are based on continuously using consecutive values of the sampled measurement, being the sampling rate several times higher than the fundamental frequency of the output AC voltage. Typically several hundreds or thousands of samples per AC period are used. Such oversampling allows a dramatic improvement in the effective measurement resolution over a whole period. Conventional oversampling allows to improve the resolution of the ADC conversions, by means of averaging multiple samples, but does not necessarily improve the accuracy of the conversions. This limitation is due to the inherent non-linearity of the ADC and the code transition uncertainty. In this invention, the offset and non-linearity asymmetry are canceled after the demodulation, so oversampling not only improves resolution, but it also produces dramatic improvements in offset accuracy. This enables reliable sub-LSB accuracy, even more than 10 times smaller than 1 LSB in real applications.

As compared to sampling DC signals, acquiring signals that continuously swing across the entire ADC range presents additional challenges because any non-linearity that produces an asymmetry between the positive and the negative range of the ADC causes an artificial offset that the controller will try to compensate, thus creating an effective offset at the output. The system of the invention is able to compensate asymmetry present in the ADC transfer function by multiplying the differential signal by 1 and −1, thus simultaneously using both positive and negative ADC ranges.

Figure 5:
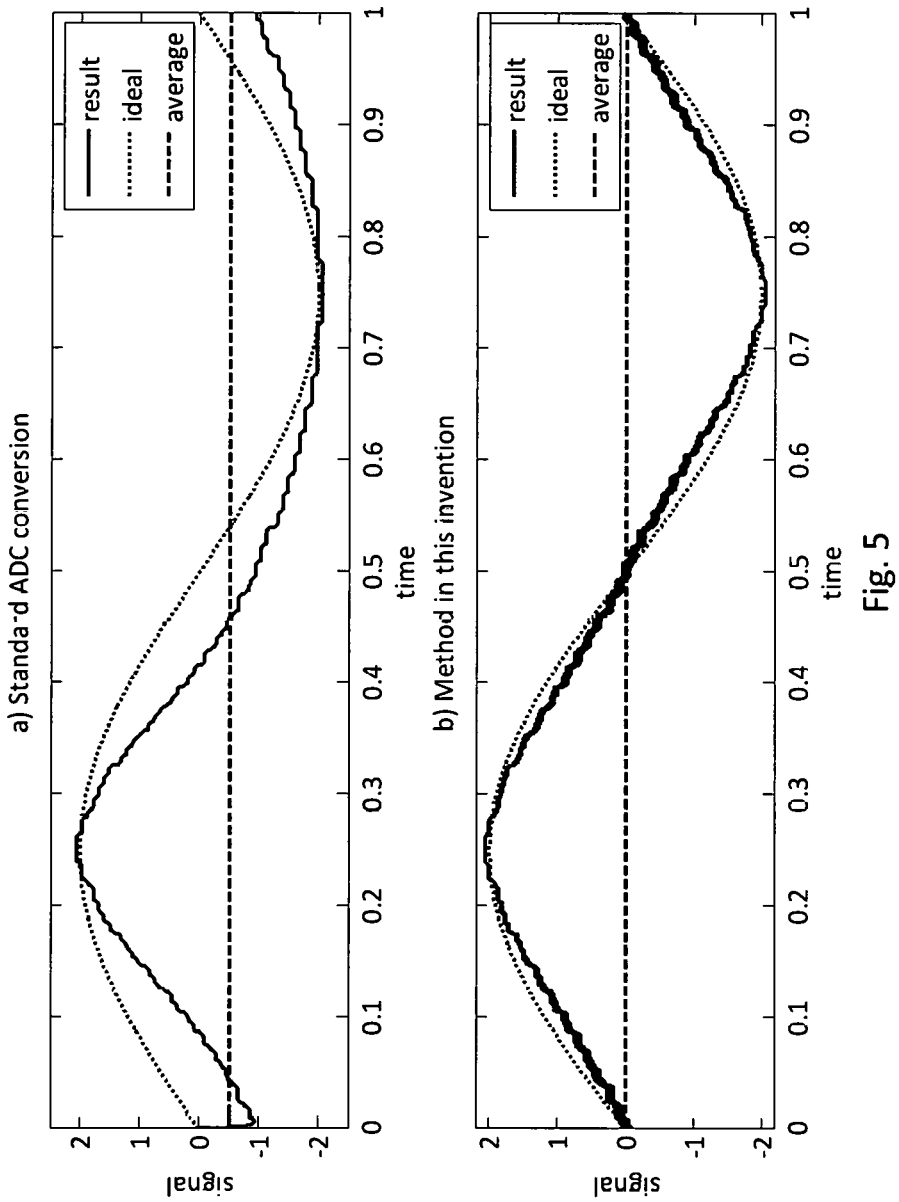
FIG. 5 is a pair of graphs that are an exaggerated example to illustrate how the non-linearity and resolution limits in an ADC are canceled by an embodiment of this invention.

FIG. 5 shows an exaggerated example to illustrate the point of how this works with a 5-bit ADC and a strong non-linearity that in FIG. 5*a*) makes the positive side of the sinewave be significantly narrower than the negative side. Even with no offset in the ADC, the DC (average) of the resultant conversions has a significant error, shown as a dashed line. This produces measurement errors and makes the control loop try to correct for an offset that does not really exist in the output. FIG. 5*b*) shows the resultant conversions obtained by applying the circuit of this invention. It can be seen that there is still an appreciable level of distortion in the acquired signal, but the positive and the negative sides are mirrored (i.e. symmetric). This makes the artificial offset be substantially, and in this example totally, canceled, and the average of the conversion is equal to zero with sub-LSB accuracy and without any calibration required.

Current technology of semiconductors presents limitations in the accuracy of analog circuits that are embedded in high-speed microprocessors ICs. This is because of the semiconductor processes required for high precision analog are not the same as the ones for high speed digital electronics. As stated before in this document, it is highly desirable to be able to use microprocessors with on-chip peripherals, such as ADCs, because it dramatically reduces size, complexity and cost. The present invention allows the use of modest-accuracy ADCs, often available in microcontrollers and digital signal processors, and still obtain substantially improved performance in terms of offset and distortion symmetry.

While embodiments have been described in detail, it should be appreciated that various modifications and/or variations may be made without departing from the scope or spirit of the invention. In this regard it is important to note that practicing the invention is not limited to the applications described herein. Many other applications and/or alterations may be utilized provided that such other applications and/or alterations do not depart from the intended purpose of the invention. Also, features illustrated or described as part of one embodiment may be used in another embodiment to provide yet another embodiment such that the features are not limited to the embodiments described herein. Thus, it is intended that the invention cover all such embodiments and variations. Nothing in this disclosure is intended to limit the scope of the invention in any way.

What is claimed is:

1. A high voltage AC measurement system to measure with zero offset and mirrored distortion based on hybrid chopping and fully differential signal path, the system comprising:
    means for signal modulation done in the analog domain by using switches at mid or high voltage level;
    a fully differential signal path that includes dual simultaneous sampling for symmetry between channels and minimize delays;

means for converting sampled analog signals to digital; and means for signal demodulation done with digital signal processing after an analog to digital conversion.

2. A high voltage AC measurement system for a high voltage AC source, comprising:

a first stage including a differential voltage divider that attenuates a high voltage input from the high voltage AC source and produces a differential mid-voltage output;

a second stage including two pairs of analog switches coupled to the differential mid-voltage output, the second stage producing a switched output;

a third stage including a pair of differential amplifiers coupled to the switched output, the second stage swapping the inputs of the pair of differential amplifiers, and one of the pair of differential amplifiers has reversed input polarity, the pair of differential amplifiers produces two single-ended signals corresponding to a positive version and a negative versions of the switched output, the two single-ended signals alternate at each chopping cycle depending on the position of the switches;

a fourth stage including two sample and hold circuits respectively coupled to one of the two single-ended signals, each of the two single-ended signals coupled to a respective analog to digital converter together simultaneously producing respective digital signals;

and a fifth stage including an adder which adds the respective digital signals and produces an added output, a multiplier which demodulates the added output, and a chopping clock, which produces a plurality of chopping cycles, and synchronizes the multiplier, the sample and hold circuits, the respective analog to digital converters, and the second stage switches, the fifth stage producing a digital representation of AC high voltage signal.

* * * * *